(12) United States Patent
Kahng et al.

(10) Patent No.: US 11,941,196 B2
(45) Date of Patent: Mar. 26, 2024

(54) DISPLAY DEVICE

(71) Applicant: Samsung Display Co., Ltd., Yongin-si (KR)

(72) Inventors: Changwoo Kahng, Hwaseong-si (KR); Dongik Koo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 17/594,596

(22) PCT Filed: Apr. 24, 2020

(86) PCT No.: PCT/KR2020/005476
§ 371 (c)(1),
(2) Date: Oct. 22, 2021

(87) PCT Pub. No.: WO2020/218893
PCT Pub. Date: Oct. 29, 2020

(65) Prior Publication Data
US 2022/0179522 A1 Jun. 9, 2022

(30) Foreign Application Priority Data
Apr. 26, 2019 (KR) .................. 10-2019-0048948

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0446* (2019.05); *G06F 3/047* (2013.01);
(Continued)

(58) Field of Classification Search
CPC ........ G06F 3/0446; G06F 3/047; G06F 3/044; G06F 3/0412; G06F 2203/04103; G06F 2203/04105; H10K 59/40
(Continued)

(56) References Cited

U.S. PATENT DOCUMENTS 5,806,388 A 9/1998 Imataki
9,715,302 B2 7/2017 Kim et al.
(Continued)

FOREIGN PATENT DOCUMENTS

| CN | 105260058 A | 1/2016 |
|---|---|---|
| CN | 105938405 A | 9/2016 |

(Continued)

OTHER PUBLICATIONS

International Search Report for corresponding Application No. PCT/KR2020/005476 dated Jul. 27, 2020, 4 pages.
(Continued)

*Primary Examiner* — Jimmy H Nguyen
(74) *Attorney, Agent, or Firm* — Lewis Roca Rothgerber Christie LLP

(57) ABSTRACT

A display device includes: a display panel; a bracket opposite the display panel; a sensing electrode to form a capacitance with the bracket; a first pad connected to the sensing electrode; a first printed circuit board overlapping with the first pad; a first adhesive contacting the first pad and the first printed circuit board; and a second adhesive contacting the display panel and the first printed circuit board.

16 Claims, 10 Drawing Sheets

(51) Int. Cl.
  *G06F 3/047* (2006.01)
  *H10K 59/40* (2023.01)
(52) U.S. Cl.
  CPC ... *H10K 59/40* (2023.02); *G06F 2203/04103* (2013.01); *G06F 2203/04105* (2013.01)
(58) Field of Classification Search
  USPC .......................................................... 345/174
  See application file for complete search history.

(56) References Cited

U.S. PATENT DOCUMENTS

| | | | |
|---|---|---|---|
| 10,133,391 B2 | 11/2018 | Kim | |
| 2008/0068342 A1 | 3/2008 | Chang et al. | |
| 2011/0291978 A1 | 12/2011 | Ho et al. | |
| 2014/0320759 A1 | 10/2014 | Jeong et al. | |
| 2015/0050492 A1 | 2/2015 | Kim et al. | |
| 2015/0267089 A1 | 9/2015 | Niimi et al. | |
| 2016/0034087 A1 | 2/2016 | Kim et al. | |
| 2016/0035290 A1* | 2/2016 | Kim ...................... | G06F 3/0446 345/174 |
| 2016/0062516 A1 | 3/2016 | Jeong et al. | |
| 2016/0291767 A1 | 10/2016 | Ding et al. | |
| 2016/0370908 A1* | 12/2016 | Kim ...................... | G06F 3/0412 |
| 2018/0143716 A1 | 5/2018 | Choi et al. | |
| 2018/0203321 A1 | 7/2018 | Shin et al. | |
| 2018/0293420 A1 | 10/2018 | Kim et al. | |
| 2018/0307361 A1* | 10/2018 | Park ...................... | G06F 3/0445 |
| 2018/0307369 A1 | 10/2018 | Park et al. | |
| 2018/0321780 A1 | 11/2018 | Park et al. | |
| 2019/0102027 A1 | 4/2019 | Yoo | |

FOREIGN PATENT DOCUMENTS

| | | |
|---|---|---|
| CN | 109254680 A | 1/2019 |
| KR | 10-2017-0093627 A | 8/2017 |
| KR | 10-2017-0134629 A | 12/2017 |
| KR | 10-2018-0005321 A | 1/2018 |
| KR | 10-2018-0029220 A | 3/2018 |
| KR | 10-1835674 B1 | 3/2018 |
| KR | 10-2018-0116188 A | 10/2018 |
| KR | 10-2018-0118846 A | 11/2018 |
| KR | 10-2018-0123395 A | 11/2018 |
| KR | 10-1956295 B1 | 3/2019 |

OTHER PUBLICATIONS

Chinese Office Action dated Sep. 16, 2023, issued in corresponding Chinese Patent Application No. 202010327240.8 (7 pages).
Chinese Office Action dated Sep. 19, 2023, issued in corresponding Chinese Patent Application No. 202080030014.1 (7 pages).

* cited by examiner

*545:545-1,545-2,545-3,545-4

DISPLAY DEVICE

CROSS-REFERENCE TO RELATED APPLICATION(S)

This application is a U.S. National Phase Patent Application of International Patent Application Number PCT/KR2020/005476, filed on Apr. 24, 2020, which claims priority to Korean Patent Application Number 10-2019-0048948, filed on Apr. 26, 2019, the entire content of all of which is incorporated herein by reference.

BACKGROUND

1. Field

Aspects of embodiments of the present disclosure relate to a display device, and more particularly, to a display device including a sensor, and an improved connection between a printed circuit board (e.g., a flexible printed circuit board) and the sensor.

2. Discussion of the Related Art

Touch-type display devices are widely used in various fields to provide improved convenience for users. For example, in recent years, in the field of a force touch-type display device capable of not only sensing a touch of a screen, but also capable of sensing a pressure of touching the screen, an integrated force touch scheme is being developed in which a sensing electrode is printed on a rear surface of a display panel, without using a sensor sheet, thereby reducing a thickness of the display device.

The above information disclosed in this Background section is for enhancement of understanding of the background of the present disclosure, and therefore, it may contain information that does not constitute prior art.

SUMMARY

When a sensing electrode is formed through printing on a rear surface of a display panel, the display panel on which the sensing electrode is printed may be connected to a printed circuit board by attaching the display panel and the printed circuit board to each other through a conductive tape. However, when a pressure according to a user's touch is applied to a connection portion between the sensor and the printed circuit board, the display panel may deform (e.g., may warp), but the printed circuit board may not deform by virtue of its stiffness. Accordingly, the conductive tape attached to the sensing electrode may be detached from the printed circuit board, and thus, signals may not be detected normally because signals detected by the sensor may not be transmitted or may not be transmitted normally.

Embodiments of the present disclosure are directed to a display device including a sensor, and an improved connection (e.g., an improved connection structure) between a printed circuit board and the sensor.

According to an embodiment, a display device includes: a display panel; a bracket opposite the display panel; a sensing electrode configured to form a capacitance with the bracket; a first pad connected to the sensing electrode; a first printed circuit board overlapping with the first pad; a first adhesive contacting the first pad and the first printed circuit board; and a second adhesive contacting the display panel and the first printed circuit board.

In some embodiments, the display device may further include an elastic element between the display panel and the bracket, and the sensing electrode may be located between the elastic element and the display panel.

In some embodiments, the second adhesive may be spaced from the first adhesive in a plan view.

In some embodiments, the display device may further include a second pad on the first printed circuit board. The first adhesive may contact the first pad and the second pad, and the second adhesive may be spaced from the second pad and the first adhesive, and may partially surround the first adhesive in a plan view.

In some embodiments, the first adhesive may include a conductive tape, and the second adhesive may include a non-conductive tape.

In some embodiments, the first adhesive may include a conductive sponge.

In some embodiments, the second adhesive may have an adhesive force greater than an adhesive force of the first adhesive.

In some embodiments, an adhesive force between the second adhesive and the first printed circuit board may be greater than an adhesive force between the first adhesive and the first printed circuit board.

In some embodiments, the display device may further include a second printed circuit board connected to the first printed circuit board through a wiring, and the second printed circuit board and the first printed circuit board may be spaced from each other and may not overlap with each other.

In some embodiments, the display device may further include: a first driver mounted on the first printed circuit board, and electrically connected to the first pad; and a second driver connected to the display panel. The second printed circuit board may be connected to the first driver through a wiring, and the first driver may be connected to the second driver through a wiring.

In some embodiments, the second adhesive may include: a filler including particles having a size in a range from 2 nm to 500 nm; and a binder securing the filler.

In some embodiments, the filler may include at least one of $BaSO_4$, $TiO_2$, $SiO_2$, or carbon black.

In some embodiments, the binder may include at least one of an acrylic resin or an epoxy resin.

In some embodiments, the second adhesive may have an adhesive force in a range from 1.0 kgf/in to 3.0 kgf/in.

According to an embodiment, a display device includes: a display panel; a bracket opposite the display panel; a sensing electrode configured to form a capacitance with the bracket; a first pad connected to the sensing electrode; a first printed circuit board overlapping with the first pad; and a second printed circuit board connected to the first printed circuit board by a wiring. The first printed circuit board and the second printed circuit board may be spaced from each other and may not overlap with each other.

In some embodiments, the display device may further include an elastic element between the display panel and the bracket, and the sensing electrode may be located between the elastic element and the display panel.

In some embodiments, the display device may further include: a first driver mounted on the first printed circuit board, and electrically connected to the first pad; and a second driver connected to the display panel. The second printed circuit board may be connected to the first driver through a wiring, and the first driver may be connected to the second driver through a wiring.

In some embodiments, the display device may further include: a first adhesive contacting the first pad and the first printed circuit board; and a second adhesive contacting the display panel and the first printed circuit board.

In some embodiments, the second adhesive may be spaced from the first adhesive, and may partially surround the first adhesive in a plan view.

In some embodiments, the first adhesive may include a conductive tape or a conductive sponge, and the second adhesive may include a non-conductive tape.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
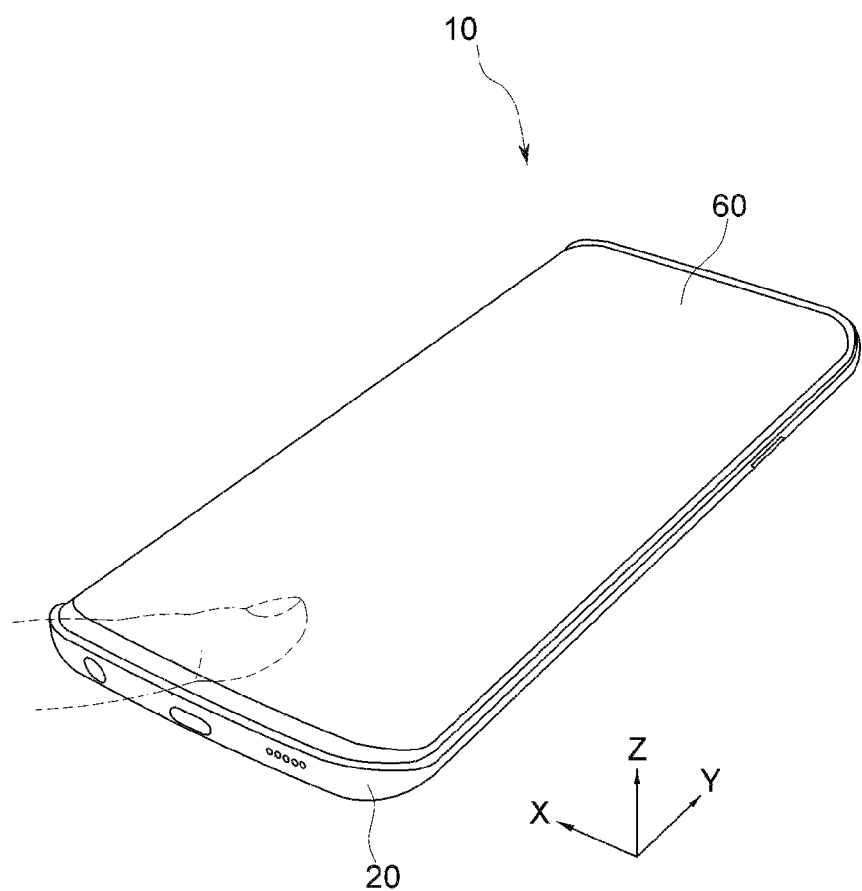
FIG. 1 is a perspective view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

In the drawings, the relative sizes of elements, layers, and regions may be exaggerated and/or simplified for clarity. For example, in the drawings, thicknesses of a plurality of layers and areas are illustrated in an enlarged manner for clarity and ease of illustration thereof. Spatially relative terms, such as "beneath," "below," "lower," "under," "above," "upper," "over," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

Further, when a layer, area, or element is referred to as being "over" another layer, area, or element, intervening layers, areas, or elements may be present therebetween or it may be directly on the other layer, area, or element. Conversely, when a layer, area, or element is referred to as being "directly on" another layer, area, or element, intervening layers, areas, or elements may be absent therebetween. Similarly, when a layer, area, or element is referred to as being "below" another layer, area, or element, it may be directly below the other layer, area, or element, or intervening layers, areas, or elements may be present therebetween. Conversely, when a layer, area, or element is referred to as being "directly below" another layer, area, or element, intervening layers, areas, or elements may be absent therebetween.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device may be described in more detail as an organic light emitting diode (OLED) display device, but the present disclosure are not limited thereto. For example, in various embodiments, the display device may be applied to (e.g., may be) a liquid crystal display (LCD) device or a plasma display device.

A display device according to various embodiments of the present disclosure may include (or may be implemented as), for example, at least one of a smartphone, a tablet personal computer (PC), a mobile phone, a video phone, an e-book reader, a television, a desktop PC, a laptop PC, a netbook computer, a workstation, a server, a personal digital assistant (PDA), a portable multimedia player (PMP), an MP3 player, a mobile medical apparatus, a camera, a wearable device, or the like. According to various embodiments, the wearable device may include (e.g., may be) an accessory type (e.g., a watch, a ring, a bracelet, an anklet, a necklace, glasses, contact lenses, or a head-mounted device (HMD)), a textile or clothing attached type (e.g., electronic apparel), a body attached type (e.g., skin pads or tattoos), a bio-implantable type (e.g., implantable circuits), or the like.

In various embodiments of the present disclosure, the display device may be one of such various devices described above, or a combination thereof. A display device according to an embodiment may be a flexible display device. However, the display device is not limited to the above-described devices, and according to an embodiment, may include a new kind of display device or may be implemented in a new kind of device including a display device according to technological advancements.

Hereinafter, display devices according to various embodiments will be described with reference to the accompanying drawings. As used herein, the term "user" may refer to a person who uses the display device, or a device (e.g., an artificial intelligence (AI) display device) that uses the display device.

Figure 2:
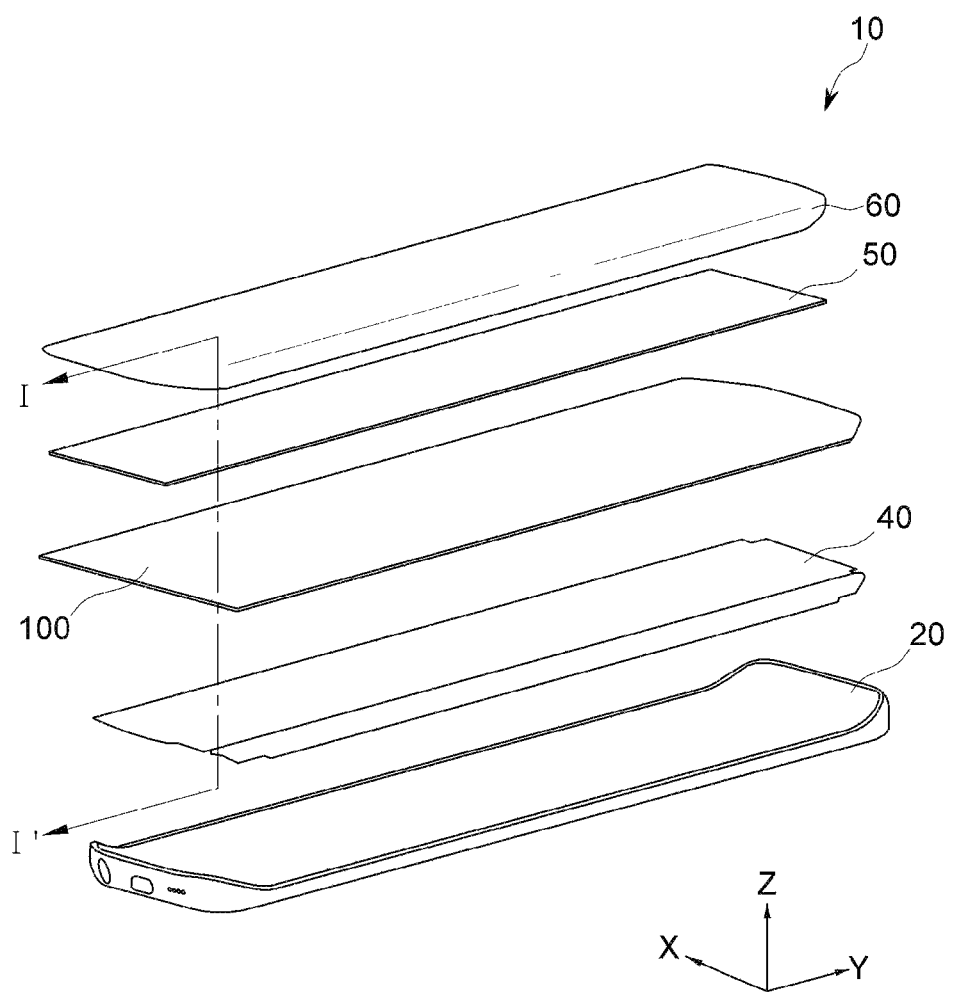
FIG. 2 is an exploded perspective view illustrating the display device illustrated in FIG. 1.

FIG. 1 is a perspective view illustrating a display device 10 according to an embodiment. FIG. 2 is an exploded perspective view illustrating the display device 10 illustrated in FIG. 1.

Referring to FIGS. 1 and 2, the display device 10 according to an embodiment may include, for example, a housing 20, a bracket 40, a display panel 100, a polarization film 50, and a cover window 60.

The cover window 60 may transmit light generated by the display panel 100. In addition, the user may perform a touch action (e.g., including a force touch action) on the cover window 60 by contacting the cover window 60 using a part of the user's body (or a touch pen). In addition, the cover window 60 has fluidity to transmit signals for notifying a touch action (or a force touch action) to a sensor S (e.g., see FIG. 3). For example, the cover window 60 may include a flexible material that may be deformed (e.g., warped), for example, such as tempered glass, reinforced plastic, and/or a polymer material. According to various embodiments, the cover window 60 may also be referred to as a glass window. In the present disclosure, the sensor S is an element to sense an external touch, a force touch, a pressure, and/or the like, which will be described in more detail below.

According to an embodiment of the present disclosure, the display panel 100 may include a liquid crystal display (LCD) panel, a light emitting diode (LED) display panel, an organic light emitting diode (OLED) display panel, a microelectromechanical systems (MEMS) display panel, an electronic paper display panel, or the like. The display panel 100 may have flexibility. The display panel 100 may be disposed under (e.g., underneath) the cover window 60, and may display various content (e.g., images, videos, and/or the like). The display panel 100 may include a substrate, a plurality of pixels PX disposed on a surface (e.g., on one surface) of the substrate, and at least one conductive line electrically connected to the pixels PX. The substrate may include a flexible material, so that at least a portion of the substrate may be bent in a direction toward a rear surface of the substrate. The conductive line may include at least one gate line or at least one data line. According to an embodiment, a plurality of gate lines and a plurality of data lines may be arranged in a matrix form, and the plurality of pixels PX may be arranged adjacent to points (e.g., crossing points or crossing areas) where the gate lines and the data lines cross each other, and may be electrically connected to the gate lines and the data lines.

The bracket 40 serves to support an overlying component, for example, such as the display panel 100. The bracket 40 may include a single-layer or a multi-layered composite sheet serving as a heat dissipation sheet for diffusing heat emitted by the display panel 100. The bracket 40 may include, for example, a magnesium alloy. In an embodiment, the bracket 40 may include a graphite sheet including graphite, and/or a copper sheet including copper. As another example, the bracket 40 may include a multi-layered structure in which a graphite sheet and/or a copper sheet are laminated. However, the present disclosure is not limited thereto, and the bracket 40 may include a metal having high conductivity and thermal conductivity, for example, such as nickel, gold, and/or silver. For example, when the bracket 40 includes a graphite sheet, the thermal conductivity in an X-Y direction is about 100 to 400 W/mK, and the thermal conductivity in a Z direction is about 1 to 30 W/mK.

According to an embodiment, the bracket 40 may be defined with (e.g., may have) a through hole through which a portion of the overlying component may pass. In addition, according to an embodiment, a swelling gap may be defined in the bracket 40 in consideration of a swelling of a battery due to aging.

The housing 20 may support the bracket 40, and may accommodate each component of the display device 10. In appearance, the housing 20 may form an internal appearance and/or an external appearance of the display device 10. The housing 20 may also be referred to as a rear case, a rear plate, or the like. The housing 20 may include an area that is not exposed to (e.g., that is hidden or covered from) the outside of the display device 10, and an area that is exposed to an outer side surface of the display device 10. For example, the area that is not exposed to the outside of the display device 10 may include a plastic injection material, and the area exposed to the outer side surface of the display device 10 may include a metal. An exposed side surface of the display device 10, including a metal material, may also be referred to as a metal bezel. According to an embodiment, at least a portion of the metal bezel may be utilized as an antenna radiator for transmitting and receiving signals of a designated frequency.

Figure 3:
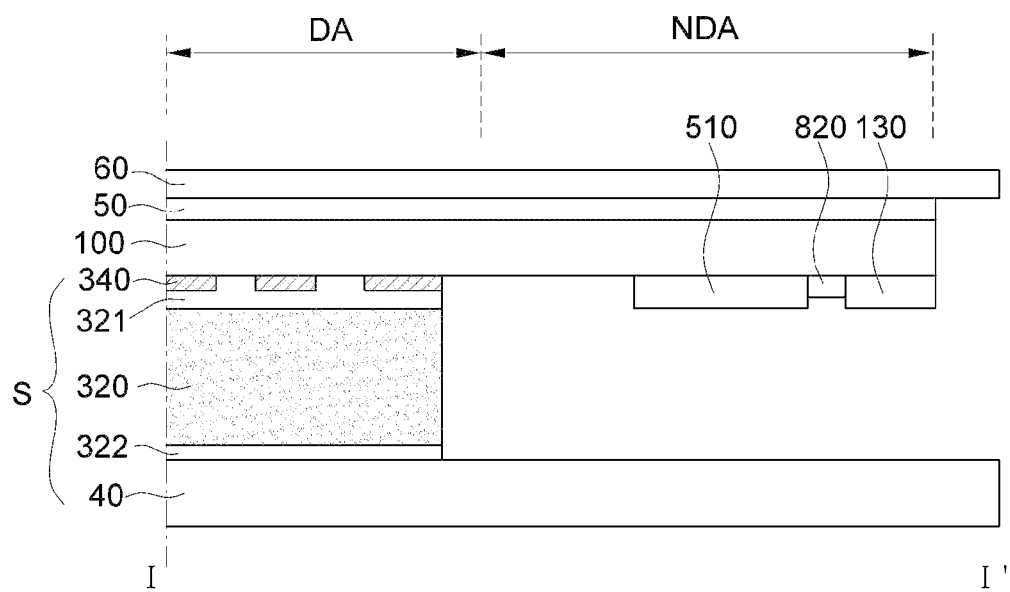
FIG. 3 is a cross-sectional view taken along the line I-I' of FIG. 2.
Figure 3:
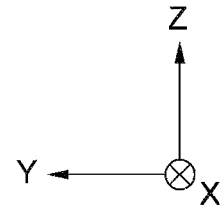
Figure 4:
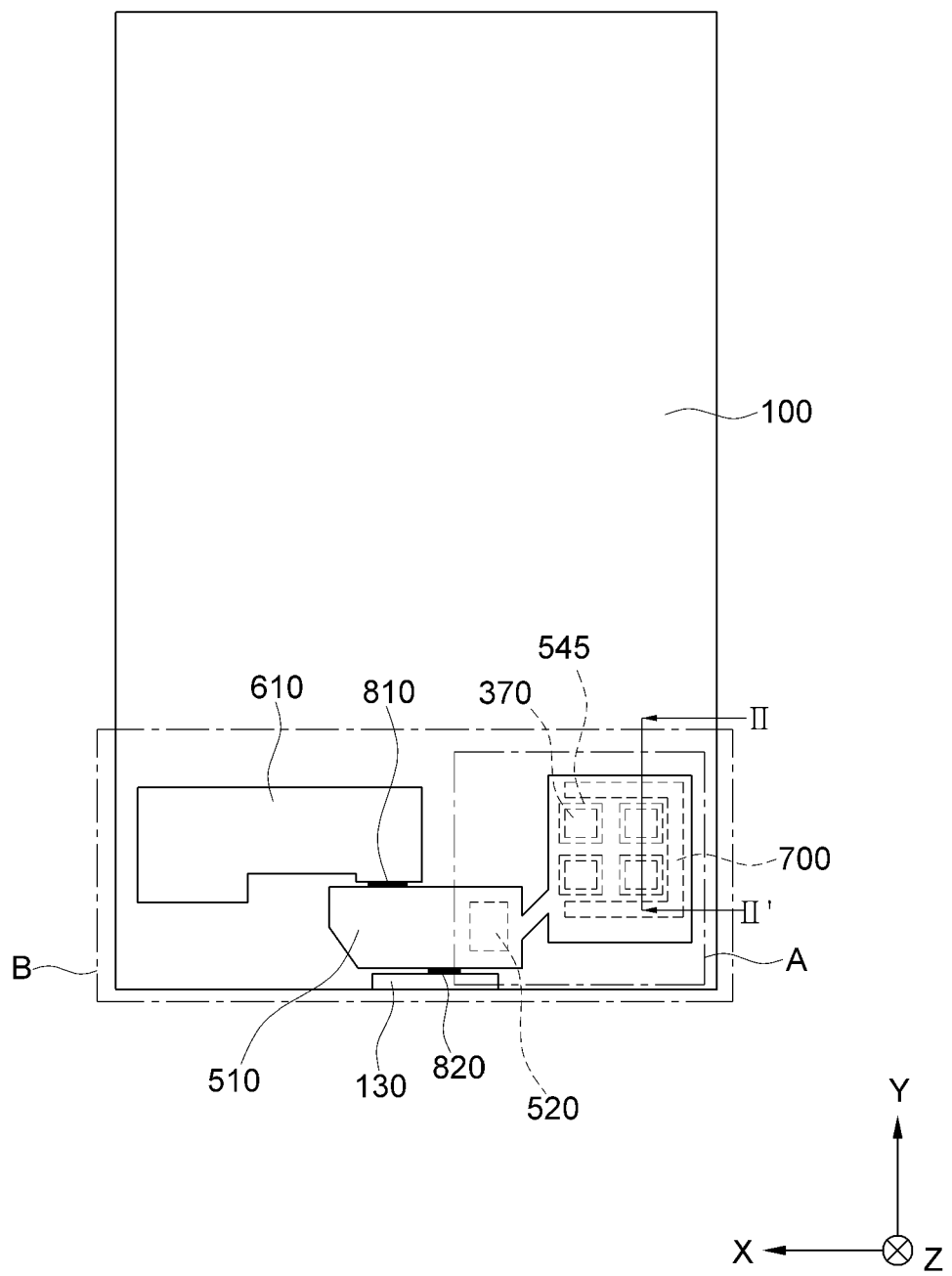
FIG. 4 is a plan view illustrating a first printed circuit board, a second printed circuit board, and a second driver disposed on a rear surface of a display panel according to an embodiment of the present disclosure.

FIG. 3 is a cross-sectional view taken along the line I-I' of FIG. 2. FIG. 4 is a plan view illustrating a first printed circuit board 510, a second printed circuit board 610, and a second driver 130 disposed on a rear surface of a display panel 100 according to an embodiment.

As illustrated in FIGS. 3 and 4, the display device 10 may further include, for example, the sensor S, the second driver 130, the first printed circuit board 510, a first driver 520, and the second printed circuit board 610 disposed between the display panel 100 and the bracket 40. According to various embodiments, the display device 10 may not include some of the components illustrated in FIGS. 1 to 4, or may further include additional components that are not illustrated in FIGS. 1 to 4.

Referring to FIG. 3, the display panel 100 includes a display area DA, and a non-display area NDA around the display area DA. The display area DA is an area for displaying a screen. A planar shape of the display area DA may be a quadrangle shape, a quadrangle shape with rounded corners, a circular shape, an elliptical shape, or various other suitable shapes. The non-display area NDA is disposed around the display area DA. For example, in some embodiments, the non-display area NDA may partially or entirely surround (e.g., around a periphery of) the display area DA. The non-display area NDA may form an edge of the display device 10. In FIG. 3, the display panel 100 is illustrated as having a flat or substantially flat panel shape, but the present disclosure is not limited thereto. In another embodiment, the display panel 100 may include a flexible material, and at least a portion of the display panel 100 may be bent in a rear direction (e.g., may be bent in a direction towards the rear surface of the display panel 100). In this case, the display panel 100 may include an upper flat portion, a bending portion, and a lower flat portion opposing the upper flat portion, and a component (e.g., the second driver 130) may be mounted on the lower flat portion.

The second driver 130 may be disposed at (e.g., in or on) the non-display area NDA on the rear surface of the display panel 100. However, the present disclosure is not limited thereto, and in some embodiments, the second driver 130 may be disposed at (e.g., in or on) the non-display area NDA on a front surface of the display panel 100. The second driver 130 may include a driving circuit and a driving wiring for transmitting a driving signal, and may drive a pixel circuit of the display area DA. According to an embodiment, the second driver 130 may include, as the driving circuit, a driver integrated circuit (IC) that provides driving signals and image signals to the display panel 100, or a timing controller (e.g., T-con) for controlling the driving signals and the image signals. The driver IC may include a gate driver IC for sequentially selecting gate signal lines of the display panel 100 and for applying scan signals (or driving signals) to the selected gate signal lines, and a data driver IC (or a source driver IC) for applying image signals (e.g., data signals) to data signal lines of the display panel 100. According to an embodiment, when the gate driver IC selects a gate signal line and applies a scan signal thereto to change a state of a corresponding pixel to an active state, the data driver IC may apply an image signal to the corresponding pixel through a data signal line. The timing controller may adjust transmission times of the signals transmitted to the driver IC, and may prevent or substantially prevent a display time difference that may occur during a process of outputting the signals to the display panel 100. In an embodiment, the second driver 130 is electrically connected to the display panel 100, and according to a signal from the second driver 130, the display panel 100 may display content (e.g., a text, an image, a video, an icon, a widget, a symbol, and/or the like).

The display device 10 may include the polarization film 50 disposed on a display surface of the display panel 100. The polarization film 50 may be attached onto the display surface of the display panel 100 using an adhesive layer. The polarization film 50 may cover an entire portion or substantially an entire portion of the display area DA. In addition, the polarization film 50 may extend outwardly from an outer edge of the display area DA to cover at least a part of the non-display area NDA.

According to an embodiment of the present disclosure, the display device 10 may further include a touch sensing layer. The touch sensing layer may be stacked between the cover window 60 and the display panel 100, and may include a touch sensor capable of sensing a contact or an approach (e.g., a proximity) of a touch object, for example, such as the user's body part or an electronic pen. In some embodiments, the touch sensing layer may be included in the display panel 100. In addition, the display device 10 may further include a battery capable of supplying power to the display device 10.

In general, a sensor may include, for example, a first conductor, and a second conductor that forms a capacitance with the first conductor. In an embodiment of the present disclosure, the sensor S includes a sensing electrode 340 as a first conductor, and the bracket 40 as a second conductor. In an embodiment, the sensor S may be a touch sensor that detects a touch from a user. In another embodiment, the sensor S may be a force touch sensor that detects not only the touch, but also a pressure (e.g., a force touch). However, the present disclosure is not limited thereto, and the sensor S may be any other suitable sensor that detects a fingerprint, an obstacle, or the like. When the sensor S is the force touch sensor, the sensor S may further include an elastic element 320. In other words, according to one or more embodiments of the present disclosure, the sensor S collectively refers to (e.g., includes), for example, the elastic element 320, the sensing electrode 340, and the bracket 40.

In an embodiment, the sensing electrode 340 may be formed on the rear surface of the display panel 100. However, the present disclosure is not limited thereto, and the sensing electrode 340 may be formed in a recess defined by patterning the display panel 100. The sensing electrode 340 forms a capacitance with the bracket 40, and based on a change in the capacitance, the sensing electrode 340 may detect whether a touch action is made (and/or an intensity of a pressure) and a location thereof.

In an embodiment of the present disclosure, the sensing electrode 340 may be connected to a first pad (e.g., see 200 of FIG. 5) to receive a sensing driving voltage (or a sensing driving current). The bracket 40 may be electrically connected to the first printed circuit board 510 or the second printed circuit board 610 to receive a reference voltage (or a reference current). For example, the bracket 40 may be directly connected to, or may be connected through a wiring to, a reference voltage pad provided at the first printed circuit board 510, and may receive the reference voltage (or the reference current). As described in more detail below with reference to FIG. 9, when the sensing electrode 340 receives the sensing driving voltage and the bracket 40 receives the reference voltage, the sensing electrode 340 and the bracket 40 may form a capacitance, and based on a change in the capacitance, may detect whether a touch action is made (and/or an intensity of a pressure) and a location thereof. In some embodiments, for example, a shielding layer may be formed at (e.g., in or on) an underlying area of the bracket 40. The shielding layer may shield electromagnetic waves and noise signals from the underlying area of the bracket 40, and may prevent or substantially prevent the sensing electrode 340 from forming a parasitic capacitance with a conductor different from the bracket 40.

In an embodiment of the present disclosure, the first printed circuit board 510 may be a sensing printed circuit board. In an embodiment, the first printed circuit board 510 may be implemented as a flexible printed circuit board (FPCB) or a rigid printed circuit board (rigid PCB). In FIG. 4, the first printed circuit board 510 is illustrated as being disposed on the rear surface of the display panel 100, but the present disclosure is not limited thereto, and the first printed circuit board 510 may be implemented as a flexible printed circuit board that may be bent, such that a portion thereof may be bent and disposed at (e.g., in or on) the non-display area on the front surface of the display panel 100.

Referring to FIG. 4, in an embodiment of the present disclosure, the first driver 520, a second pad 545, and a second adhesive 700, for example, may be mounted on the first printed circuit board 510. The second pad 545 and the second adhesive 700 will be described in more detail below. FIG. 4 is a plan view showing the rear surface of the first printed circuit board 510, and thus, components disposed on the front surface of the first printed circuit board 510 are illustrated with dotted lines. Although not illustrated in FIG. 4, the first driver 520 may be electrically connected to the sensor S, may transmit a sensing driving voltage and the like to the sensor S, and may receive a sensing signal (e.g., a touch signal and a pressure signal) from the sensor S to detect whether a touch action is made (and/or an intensity of a pressure) and a location thereof. In an embodiment, the first driver 520 may also serve as a sensing controller for controlling the sensor S. In an another embodiment, the sensing controller may be separately configured as an integrated circuit chip, and mounted on the first printed circuit board 510 or the second printed circuit board 610.

In an embodiment of the present disclosure, the second printed circuit board 610 may be a main printed circuit board or a main flexible printed circuit board. According to an embodiment, various electronic components, devices, printed circuits, and the like of the display device 10 may be mounted or arranged on the second printed circuit board 610. A processor, a communication module (e.g., a communication device), various interfaces, a power management module (e.g., a power management device), and/or the like may be mounted on the second printed circuit board 610 in the form of an integrated circuit chip. In addition, a display panel controller and a sensing controller for controlling the display panel 100 and the sensor S, respectively, may be configured as an integrated circuit chip to be mounted on the second printed circuit board 610. For example, the sensing controller may be a part of the aforementioned processor.

Hereinafter, the display panel 100 and the sensor S will be described in more detail with reference to FIGS. 5 to 9.

Figure 5:
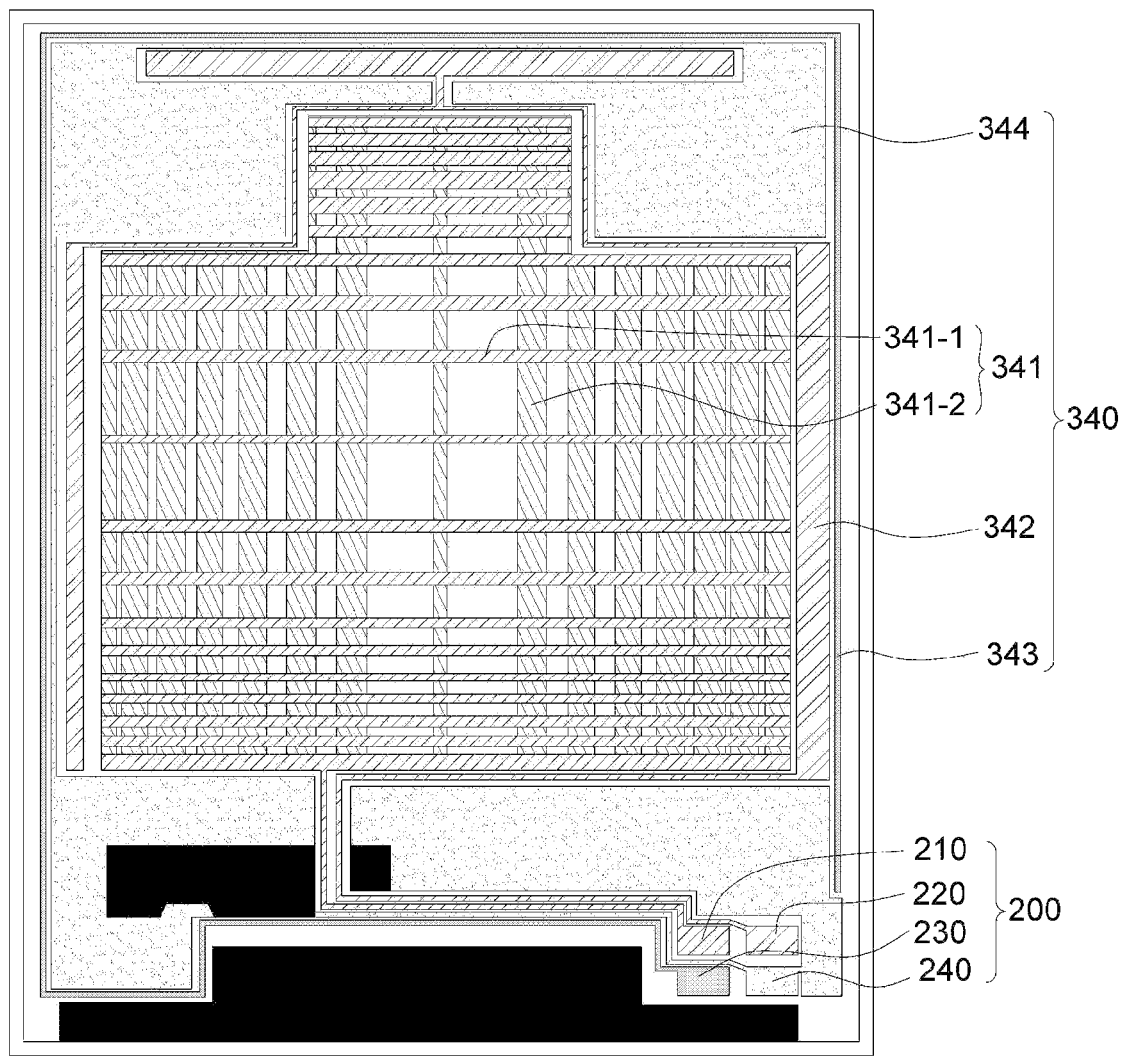
FIG. 5 is a plan view illustrating a sensing electrode and a first pad disposed on a rear surface of a display panel according to an embodiment of the present disclosure.
Figure 6:
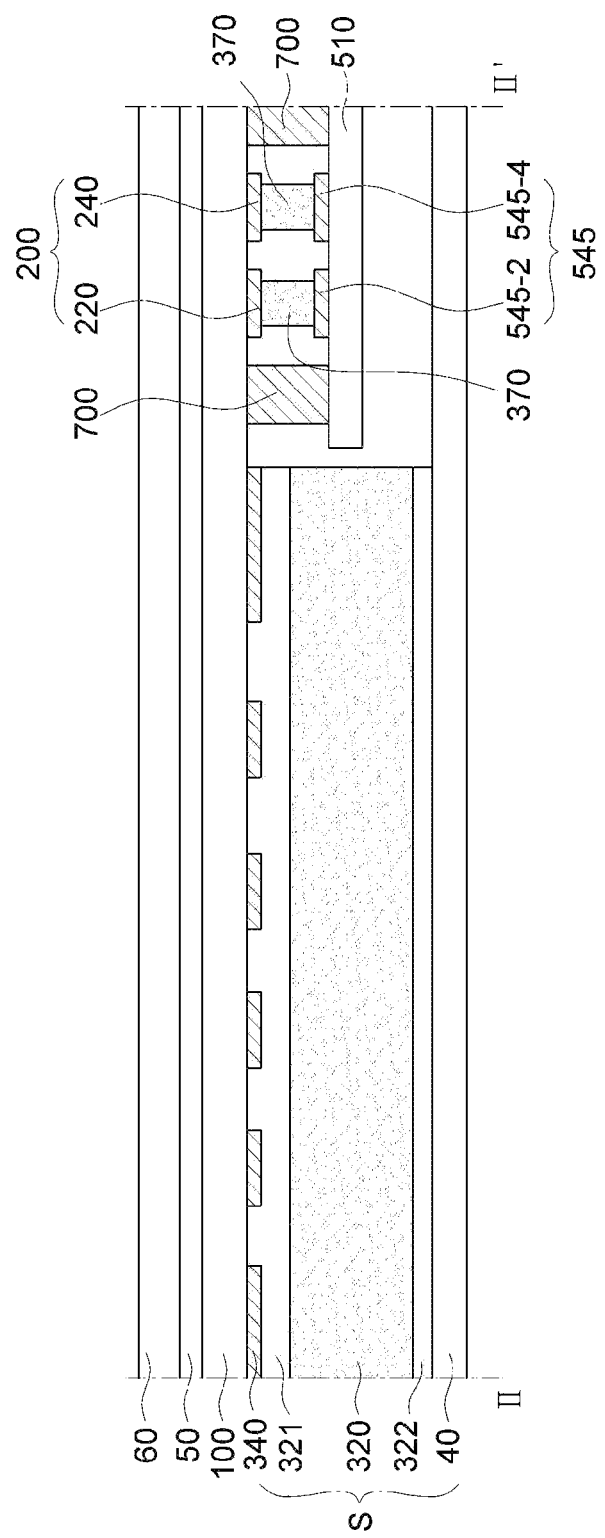
FIG. 6 is a cross-sectional view taken along the line II-II' of FIG. 4 according to an embodiment of the present disclosure.
Figure 7:
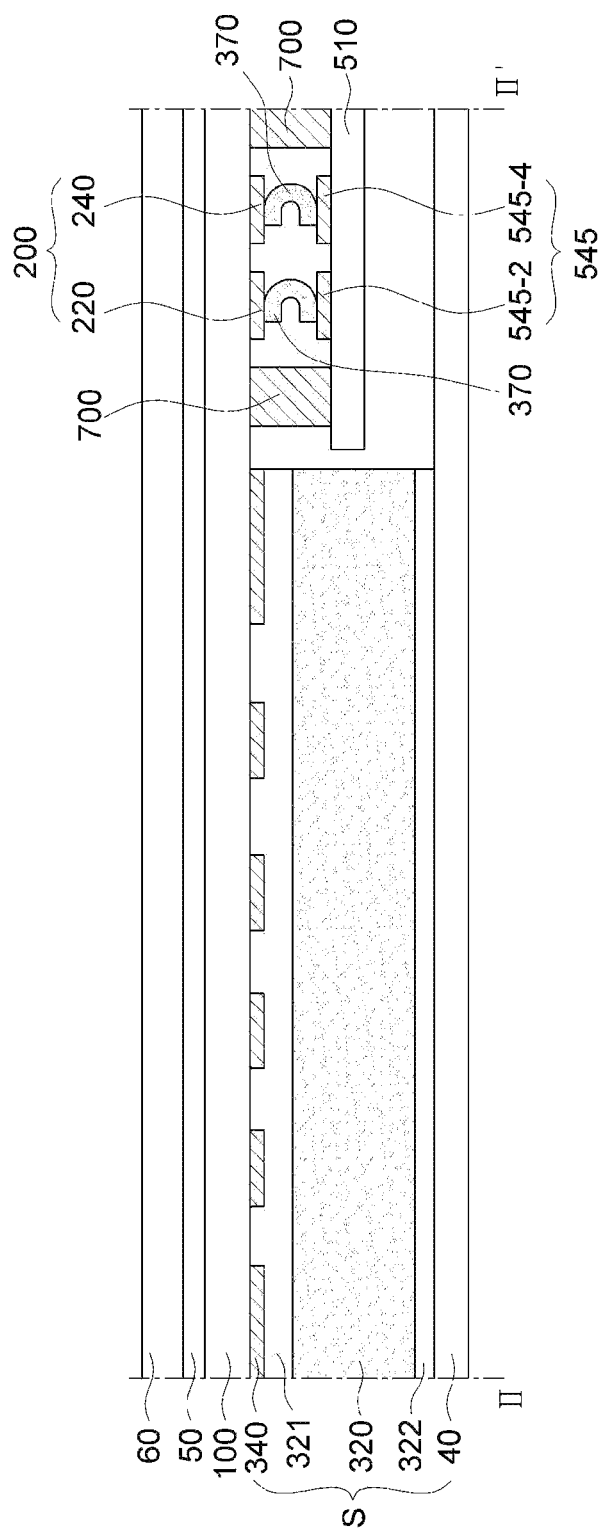
FIG. 7 is a cross-sectional view taken along the line II-II' of FIG. 4 according to another embodiment of the present disclosure.
Figure 8:
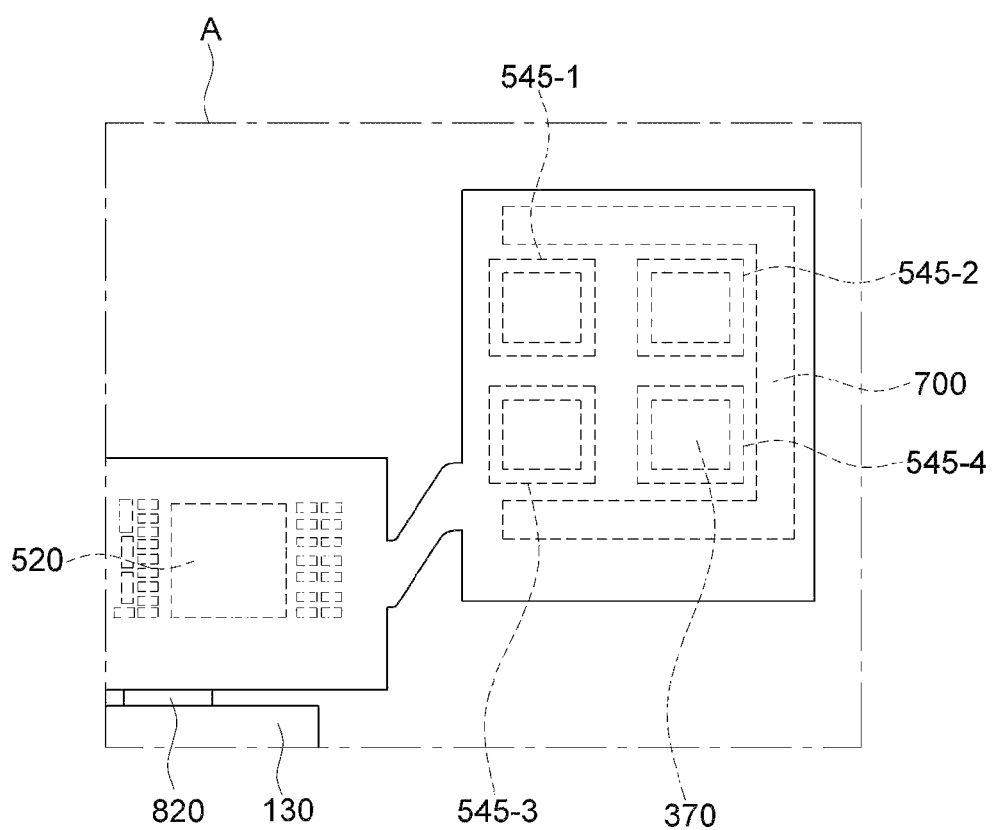
FIG. 8 is an enlarged plan view illustrating the area A of FIG. 4.
Figure 9:
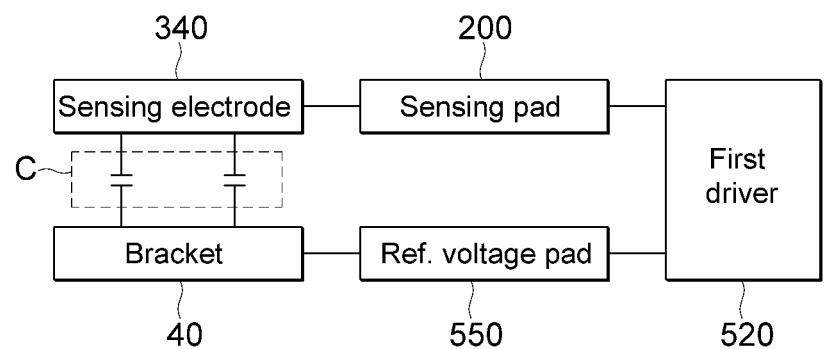
FIG. 9 is a block diagram illustrating a sensor according to an embodiment of the present disclosure.

FIG. 5 is a plan view illustrating a sensing electrode and a first pad disposed on a rear surface of a display panel according to an embodiment of the present disclosure. FIG. 6 is a cross-sectional view taken along the line II-II' of FIG. 4 according to an embodiment of the present disclosure. FIG. 7 is a cross-sectional view taken along the line II-II' of FIG. 4 according to another embodiment of the present disclosure. FIG. 8 is an enlarged plan view illustrating the area A of FIG. 4. FIG. 9 is a block diagram illustrating a sensor according to an embodiment of the present disclosure.

As illustrated in FIG. 5, the sensing electrode 340 may be disposed on the rear surface of the display panel 100. According to an embodiment of the present disclosure, the sensing electrode 340 may be formed by applying or printing a conductive paste. The conductive paste is prepared by mixing a film-forming agent and a metal powder. Examples of the film-forming agent may include epoxies using cross-linking properties; liquids such as linseed oil, soybean oil, lacquer, tung oil, and synthetic drying oil; natural resins such as shellac and copal; processed resins such as limed rosin; synthetic resins such as phenol resins, urea resins, melamine resins, and vinyl resins; cellulose derivatives such as nitrocellulose and acetylcellulose; rubber derivatives such as synthetic rubber; polyvinyl alcohol; and solids, such as casein, that are dissolved in a solvent. Examples of the metal powder of the conductive paste may include gold, silver, platinum, palladium, and copper having high electric conductivity. However, the present disclosure is not limited thereto, and the sensing electrode 340 may be formed by other suitable methods, for example, such as printing (inkjet printing, gravure printing, imprinting, roll printing, and/or the like), or a photolithography process using a metal thin film.

In an embodiment, the sensing electrode 340 may include a first sensing electrode 341 disposed at a center portion of the display panel 100, a second sensing electrode 342 partially disposed at an upper end portion and at opposite end portions of the display panel 100 in a plan view, a third sensing electrode 343 partially surrounding (e.g., around a periphery of) an outer edge of the display panel 100, and a fourth sensing electrode 344 disposed at an area other than the areas where the first, second, and third sensing electrodes 341, 342, and 343 are disposed. However, the configuration of the sensing electrode 340 is not limited thereto, and at least one of the first to fourth sensing electrodes 341, 342, 343, and 344 may be omitted, and/or the sensing electrode 340 may further include an additional sensing electrode. In an embodiment, the first sensing electrode 341 may include a plurality of first sub-sensing electrodes 341-1 extending in a first direction (e.g., the X direction) and spaced apart from each other, and a plurality of second sub-sensing electrodes 341-2 extending in a second direction (e.g., the Y direction) crossing the first direction and spaced apart from each other, forming a grid. The second to fourth sensing electrodes 342, 343, and 344 may be disposed to have a relatively large area in order to improve sensing sensitivity of an outer region having a relatively low sensing sensitivity. However, the present disclosure is not limited thereto, and each of the first to fourth sensing electrodes 341, 342, 343, and 344 may have various suitable arbitrary shapes.

Each of the first to fourth sensing electrodes 341, 342, 343, and 344 may have a sensing region corresponding thereto. The sensing region may be defined as a region at which a touch input or a force touch input by a user may be sensed, and may include regions overlapping with the sensing electrodes 341, 342, 343, and 344 as well as regions around them. The sensing electrodes 340 may be disposed to be spaced apart from the area in which the first printed circuit board 510, the second printed circuit board 610, and the second driver 130 are disposed, so as to not overlap with the area.

The first and second sub-sensing electrodes 341-1 and 341-2 and the second to fourth sensing electrodes 342, 343, and 344 may be formed at (e.g., in or on) different layers. However, the present disclosure is not limited thereto, and the first and second sub-sensing electrodes 341-1 and 341-2 and the second to fourth sensing electrodes 342, 343, and 344 may be formed at (e.g., in or on) the same layer with an insulator disposed therebetween to be insulated from each other. In addition, each of the first and second sub-sensing electrodes 341-1 and 341-2 and the second to fourth sensing electrodes 342, 343, and 344 may be connected to one another using a bridge electrode, or may be separated from each other.

The first to fourth sensing electrodes 341, 342, 343, and 344 may be connected to the first pad 200 to receive the sensing driving voltage. In an embodiment, each of the first to fourth sensing electrodes 341, 342, 343, and 344 may further include a wiring to be connected to the first driver 520 or the sensing controller to transmit the sensing signal to the first driver 520 or the sensing controller.

In another embodiment of the present disclosure, the sensing electrode 340 may include a conductive tape including an adhesive layer, a conductive layer, and an insulating layer. In some embodiments, the insulating layer may be omitted. Each of the conductive layer and the adhesive layer of the conductive tape may include a conductive fiber and an adhesive. A conductive fiber, aluminum, copper, nickel foil, or the like may be used as a base of the conductive layer, and the adhesive may be provided on one surface of the conductive layer. The conductive layer may be formed to include various materials and/or compositions, for example, such as nickel (Ni), copper (Cu), a mixture of copper and nickel (e.g., Cu+Ni), a mixture of copper, nickel, and gold (e.g., Cu+Ni+Au), a mixture of copper, nickel, and other metals (e.g., Cu+Ni+other metals), a mixture of copper, nickel, and a resin (e.g., Cu+Ni+Resin), and/or the like, using an electroless plating method.

Referring to FIG. 5, the first pad 200 may be disposed on the rear surface of the display panel 100. The first pad 200 may be connected to the sensing electrode 340, may supply the sensing driving voltage to the sensing electrode 340, and may receive the sensing signal according to a user's touch input, so that the touch input may be detected. In another embodiment, the first pad 200 may be omitted, and the sensing electrode 340 may be electrically connected to (e.g., directly electrically connected to) the second pad (e.g., see 545 in FIG. 4) or the first driver 520 to receive the sensing driving voltage and the like.

In an embodiment, the first pad 200 may include a first sensing pad 210, a second sensing pad 220, a third sensing pad 230, and a fourth sensing pad 240. For example, the first sensing pad 210 may be connected to the first sensing electrode 341 to supply the sensing driving voltage and to detect the sensing signal, the second sensing pad 220 may be connected to the second sensing electrode 342 to supply the sensing driving voltage and to detect the sensing signal, the third sensing pad 230 may be connected to the third sensing electrode 343 to supply the sensing driving voltage and to detect the sensing signal, and the fourth sensing pad 240 may be connected to the fourth sensing electrode 344 to supply the sensing driving voltage and to detect the sensing signal.

Although the first pad 200 is illustrated as being disposed on the rear surface of the display panel 100, the present disclosure is not limited thereto, and in some embodiments, the first pad 200 may be disposed within a recess that is defined as the rear surface of the display panel 100 is patterned. In addition, although the first pad 200 is illustrated as being disposed close to (e.g., adjacent to) a lower end portion of the display panel 100 in a plan view, the present disclosure is not limited thereto. For example, in some embodiments, the first pad 200 may be positioned at an upper end portion of the display panel 100 in a plan view, at a non-display area on the front surface of the display panel 100, or at a lower flat portion of the display panel 100 that is partially bent, and may be connected to the sensing electrode 340 through a wiring.

Referring to FIG. 6, the sensor S will be described in more detail. The sensing electrode 340 illustrated in FIG. 6 may be, for example, a cross-sectional view of the plurality of first sub-sensing electrodes 341-1 arranged in parallel with the first direction (e.g., the X direction).

An elastic element 320 may be disposed between the display panel 100 and the bracket 40. In more detail, the elastic element 320 may be disposed between the sensing electrode 340 and the bracket 40. For example, one surface of the elastic element 320 may contact the sensing electrode 340, and another surface of the elastic element 320 may contact the bracket 40. In addition, adhesive layers 321 and 322 may be disposed between the elastic element 320 and the sensing electrode 340 and between the elastic element 320 and the bracket 40, respectively. The elastic element 320 may overlap with the sensing electrode 340 and the bracket 40 in a plan view, but the present disclosure is not limited thereto. For example, in an embodiment, the sensor S may serve as sensors that only detect a touch, a fingerprint, and/or the like, instead of a force touch (or a pressure), and in this case, the elastic element 320 may be omitted.

The elastic element 320 may be disposed at any suitable position where a distance between the sensing electrode 340 and the bracket 40 may change according to the pressure applied to the cover window 60. For example, the cover window 60 may be an elastic element, the elastic element 320 may be omitted, and air or any suitable dielectric material may be disposed between the bracket 40 and the sensing electrode 340. Accordingly, the elastic element 320 of the sensor S may contract according to the touch pressure applied to the cover window 60. The elastic element 320 may serve to relieve an external shock, and thus, may have an elastic force. For example, the elastic element 320 may be deformed by a pressure applied from the outside, and when the pressure from the outside is removed, the elastic element 320 may have the elastic force to be restored to its original or substantially original state.

In addition, the elastic element 320 may have insulation (e.g., insulative properties) to prevent or substantially prevent an electrical short circuit between the sensing electrode 340 and the bracket 40. The elastic element 320 may include a porous polymer to have a suitable elasticity. For example, the elastic element 320 may be provided in the form of a foam, such as a sponge.

In one or more embodiments, the elastic element 320 may include, for example, thermoplastic elastomers, polystyrene, polyolefin, polyurethane thermoplastic elastomers, polyimide, synthetic rubbers, polydimethylsiloxane, polybutadiene, polyisobutylene, poly(styrenebutadienestyrene), polyurethane, polychloroprene, polyethylene, silicone, and/or combinations thereof. However, the present disclosure is not limited thereto.

The first printed circuit board 510 may be disposed between the display panel 100 and the bracket 40 at (e.g., in or on) an area where the elastic element 320 is not disposed. A portion of the first printed circuit board 510 may overlap with the first pad 200. The first printed circuit board 510 may include a second pad 545 disposed at (e.g., in or on) an area corresponding to (e.g., overlapping with or connected to) the first pad 200. The second pad 545 may have the same or substantially the same shape and the same or substantially the same size as those of the first pad 200 in a plan view, but the present disclosure is not limited thereto. For example, as illustrated in FIG. 8, the second pad 545 may include a first sensing driving pad 545-1 disposed corresponding to the first sensing pad 210, a second sensing driving pad 545-2 disposed corresponding to the second sensing pad 220, a third sensing driving pad 545-3 disposed corresponding to the third sensing pad 230, and a fourth sensing driving pad 545-4 disposed corresponding to the fourth sensing pad 240. The second pad 545 may have the same or substantially the same shape and the same or substantially the same size as those of the first pad 200, and in FIG. 8, which illustrates the rear surface of the first printed circuit board 510, a first adhesive 370 and the second pad 545 are illustrated by a dotted line.

In an embodiment, one end portion of the second pad 545 may be electrically connected to the first driver 520, and another end portion of the second pad 545 may be electrically connected to the first pad 20 through the first adhesive 370 described in more detail below. For example, the second pad 545 may transmit the sensing driving voltage and the like from the first driver 520 to the first pad 200, and may receive the sensing signal (e.g., the touch signal) from the first pad 200 to transmit the sensing signal to the first driver 520 (or to the sensing controller). Accordingly, the first driver 520 may detect a touch and/or a pressure.

Referring again to FIG. 6, in an embodiment of the present disclosure, the first adhesive 370 may be disposed between the first pad 200 and the second pad 545. For example, the first adhesive 370 may be disposed between the first sensing pad 210 and the first sensing driving pad 545-1, between the second sensing pad 220 and the second sensing driving pad 545-2, between the third sensing pad 230 and the third sensing driving pad 545-3, and between the fourth sensing pad 240 and the fourth sensing driving pad 545-4. The first adhesive 370 may attach each of the first to fourth sensing pads 210, 220, 230, and 240 to a corresponding one of the first to fourth sensing driving pads 545-1, 545-2, 545-3, and 545-4. However, the present disclosure is not limited thereto. For example, in another embodiment, each of the first to fourth sensing pads 210, 220, 230, and 240 and each of the first to fourth sensing driving pads 545-1, 545-2, 545-3, and 545-4 may include at least two pads for transmitting and receiving signals, respectively. The at least two pads of each of the first to fourth sensing pads 210, 220, 230, and 240 may be electrically connected to the at least two pads of each corresponding one of the first to fourth sensing driving pads 545-1, 545-2, 545-3, and 545-4, and the first adhesive 370 may be disposed therebetween.

As illustrated in FIG. 6, the first adhesive 370 is disposed to contact the first pad 200 and the second pad 545. For electrical connection between the second pad 545 and the first pad 200, the first adhesive 370 may include a conductive material. In an embodiment, a conductive adhesive layer is disposed on one end portion and another end portion of the first adhesive 370, so that the one end portion and the other end portion of the first adhesive 370 may be attached to the second pad 545 and the first pad 200, respectively. Accordingly, the first adhesive 370 electrically connects the first pad 200 and the second pad 545 to each other. However, the present disclosure is not limited thereto, and in another embodiment, the first adhesive 370 may include a nonconductive material, and the second pad 545 and the first pad 200 may be electrically connected to each other through another wiring.

As illustrated in FIG. 6, in an embodiment of the present disclosure, the first adhesive 370 may include a conductive sponge. The conductive sponge may have a column shape that has a cross-section of a polygon, for example, such as a quadrangle, a circle, an ellipse, or the like in a plan view. The conductive sponge may have a structure in which copper, nickel, silver, gold, or the like is plated on a foam that has a suitable restoring force (e.g., an excellent restoring force). As illustrated in FIG. 7, in another embodiment of the present disclosure, the first adhesive 370 may include a conductive tape. However, the present disclosure is not limited thereto, and the first adhesive 370 may include any suitable conductive material that contracts or changes shape according to a deformation of the elastic element 320.

Referring to FIGS. 6 and 7, the second adhesive 700 may be disposed between the display panel 100 and the first printed circuit board 510 to attach the display panel 100 and the first printed circuit board 510 to each other. The second adhesive 700 may be a non-conductive tape. In an embodiment, an insulating layer may be further disposed between the second adhesive 700 and the display panel 100. The second adhesive 700 assists the first adhesive 370, and serves to attach the first printed circuit board 510 to the display panel 100 to prevent or substantially prevent the first printed circuit board 510 from being detached from the first pad 200.

Referring to FIG. 8, the second adhesive 700 may have a shape that partially surrounds (e.g., around a periphery of) the first adhesive 370 in a plan view, and spaced apart from the first adhesive 370. In FIG. 8, which illustrates the rear surface of the first printed circuit board 510, the first adhesive 370 and the second adhesive 700 are illustrated by dotted lines. For example, the second adhesive 700 may have one of a bracket shape (e.g., '[' shape), a 'C' shape (e.g., a '⊂' shape, a '⊃' shape, a '∪' shape, and/or a '∩' shape), a quadrangle shape, a grid shape (e.g., a '⊞' shape), or a cross shape (e.g., '+' shape), for example, in a plan view.

The second adhesive 700 may have the same or substantially the same thickness (e.g., height in the Z direction) as, or a smaller thickness than, that of the first adhesive 370. For example, the second adhesive 700 may have a thickness in a range from 5 to 15 μm. However, the present disclosure is not limited thereto, and the second adhesive 700 may have a greater thickness or a larger area than that of the first adhesive 370.

Because the second adhesive 700 may include more adhesive material than that of the first adhesive 370, the second adhesive 700 may have a greater adhesive force than that of the first adhesive 370. Accordingly, an adhesive force between the second adhesive 700 and the first printed circuit board may be greater than an adhesive force between the first adhesive 370 and the first printed circuit board. The second adhesive 700 may have an adhesive force in a range from 1.0 kgf/in to 3.0 kgf/in.

Referring to FIG. 9, as described above, the sensing electrode 340 and the bracket 40 may serve as a capacitor, and a capacitance C may be formed between the sensing electrode 340 and the bracket 40. The sensing electrode 340 may be connected to the first pad 200 to receive the sensing driving voltage, and the bracket 40 may be connected to a reference voltage pad 550 to receive a reference voltage. The first driver 520 (or the sensing controller) may be connected to the sensing electrode 340, which receives the sensing driving voltage, and the bracket 40, which receives the reference voltage, to detect a change amount of the capacitance C between the sensing electrode 340 and the bracket 40. For example, the first driver 520 may detect the change amount of the capacitance C between the sensing electrode 340 and the bracket 40 based on the sensing signal (e.g., an output signal) of the sensing electrode 340.

In an embodiment, when the user touches the cover window 60, the capacitance C between the sensing electrode 340 and the bracket 40 may change. The first driver 520 (or the sensing controller) may detect the touch based on the change in the capacitance C. In another embodiment, a thickness of the elastic element 320 may be changed by a pressure applied to the cover window 60, and accordingly, a distance between the sensing electrode 340 and the bracket 40 may be changed. In such a case, because the capacitance C between the sensing electrode 340 and the bracket 40 changes according to the distance between the sensing electrode 340 and the bracket 40, the first driver 520 may detect a magnitude of the pressure applied to the cover window 60 based on a change amount of the capacitance C.

The touch signal and the like may be provided in various suitable methods. In one example, the touch signal may be provided to the sensor (e.g., see S of FIG. 3) through a body part (e.g., a finger) of the user. However, the touch signal is not limited to any one method. According to another embodiment of the present disclosure, the touch signal may be input in an optical, contact, or magnetic method. The sensor S may sense the touch signal or the like using various suitable methods. For example, the sensor S may operate by a resistive method, a capacitive method, or an electromagnetic induction method, and may obtain coordinate information of a point (e.g., a touch point) where a touch event occurs.

Figure 10:
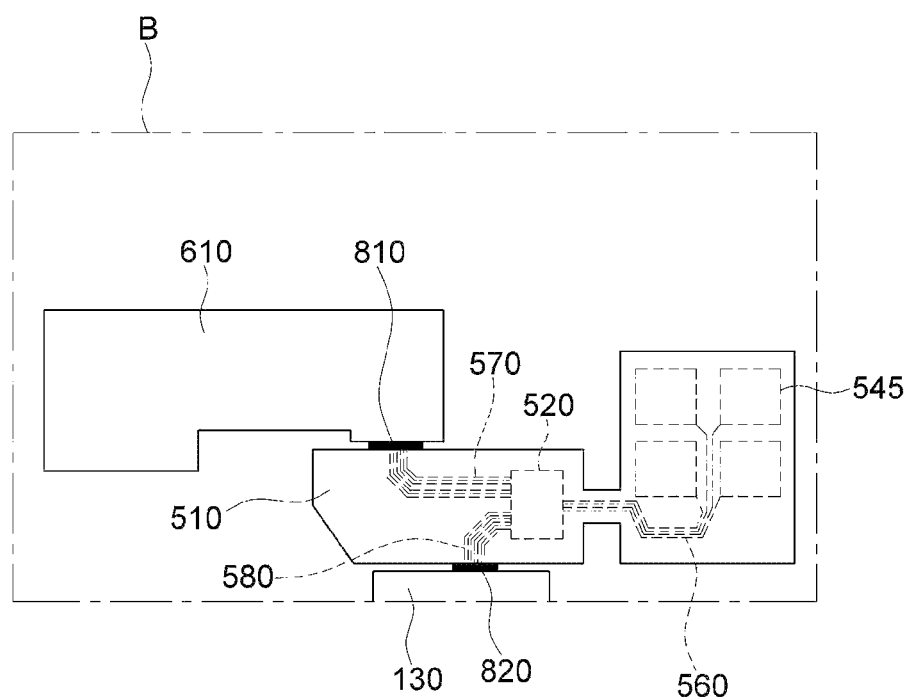
FIG. 10 is a plan view illustrating a first printed circuit board, a second printed circuit board, and a second driver from a rear surface view thereof according to an embodiment of the present disclosure.

FIG. 10 is a plan view illustrating the first printed circuit board 510, the second printed circuit board 610, and the second driver 130 from a rear surface view thereof according to an embodiment of the present disclosure. FIG. 10 illustrates an area corresponding to the area B of FIG. 4.

Referring to FIG. 10, the first printed circuit board 510, the second printed circuit board 610, the second driver 130, a first wiring pad 810, and a second wiring pad 820, for example, may be disposed on the rear surface of the display panel 100. The first printed circuit board 510 may be connected to the second printed circuit board 610 through the first wiring pad 810, and may be connected to the second driver 130 through the second wiring pad 820. In such an embodiment, the first wiring pad 810 and the second wiring pad 820 may be, for example, a connector, an anisotropic conductive film, or a wiring.

In an embodiment, the first driver 520, wirings 560, 570, and 580, and the second pad 545 may be disposed on the first printed circuit board 510. The wirings 560, 570, and 580 may include a first wiring 560, a second wiring 570, and a third wiring 580. FIG. 10 is a plan view viewed from the rear surface of the first printed circuit board 510, and thus, components disposed thereon are illustrated by dotted lines.

In an embodiment of the present disclosure, the first printed circuit board 510 may be a sensing printed circuit board. A portion of the first printed circuit board 510 may overlap with the first pad (e.g., see 200 of FIG. 6) connected to the sensing electrode (e.g., see 340 of FIG. 6). The second pad 545 of the first printed circuit board 510 may be electrically connected to the first pad. In an embodiment, in FIG. 10 illustrating the rear surface of the first printed circuit board 510, the second pad 545 that has the same or substantially the same shape and the same or substantially the same size as those of the first pad and is disposed at a position corresponding to (e.g., overlapping with) the first pad is illustrated by a dotted line, and the first pad is not shown. However, the present disclosure is not limited thereto, and the second pad 545 may have a shape that is different from that of the first pad, and the first printed circuit board 510 may overlap with only a portion of the first pad 200.

The second pad 545 may be connected to the first driver 520 through the first wiring 560. For example, the second pad 545 may receive the sensing driving voltage or the like from the first driver 520 through the first wiring 560, and may transmit the sensing driving voltage to the sensing electrode through the first pad. In addition, the second pad 545 may receive the sensing signal (e.g., a touch signal, and the like) from the sensing electrode through the first pad, and may transmit the sensing signal to the first driver 520 through the first wiring 560. Accordingly, the first driver 520 may detect the touch and the pressure. However, the present disclosure is not limited thereto, and in an embodiment, an additional wiring for transmitting the sensing signal from the sensing electrode to the first driver 520 may be provided, and/or a separate sensing controller for receiving the sensing signal from the sensing electrode and for determining the touch and the pressure may be further provided.

In an embodiment of the present disclosure, the second printed circuit board 610 may be a main printed circuit board. On the second printed circuit board 610, a controller, a circuitry, and the like capable of performing various operations (e.g., calculations) and controls may be disposed. The first wiring pad 810 of the second printed circuit board 610 may be connected to the first driver 520 of the first printed circuit board 510 through the second wiring 570. Accordingly, the controller, the circuitry, and the like positioned on the second printed circuit board 610 may receive the sensing signal received by the first driver 520 from the sensing electrode through the second wiring 570 to determine or to perform an operation, and may control the display device 10 according to a result.

In an embodiment, the second driver 130 may include a driving circuit that transmits a driving signal to the display panel 100, and may be connected to the display panel 100. The second wiring pad 820 of the second driver 130 may be connected to the first driver 520 through the third wiring 580. Accordingly, the second driver 130 may receive the signal from the first driver 520 through the third wiring 580 to drive the display panel 100.

Accordingly, in an embodiment of the present disclosure, a signal from the second printed circuit board 610 may be transmitted, through the second wiring 570 and the third wiring 580, to the second driver 130 via the first driver 520, and thus, the second printed circuit board 610 may drive and control the display panel 100. However, the present disclosure is not limited thereto, and in a state in which the first printed circuit board 510 is spaced apart from the second printed circuit board 610, the second printed circuit board 610 and the second driver 130 may be connected to each other through a separate wiring that does not pass through the first driver 520.

As illustrated in FIG. 10, in an embodiment of the present disclosure, the first printed circuit board 510 may be spaced apart from the second printed circuit board 610 so as to not overlap with the second printed circuit board 610. Accordingly, a phenomenon in which the first printed circuit board 510 and the second printed circuit board 610 may be peeled off (e.g., lifted to have a gap) when they overlap with each other may be prevented or substantially prevented, and a signal interference phenomenon due to the overlap of wirings may be minimized or reduced. In addition, the first printed circuit board 510 may also be spaced apart from the second driver 130 so as to not overlap with the second driver 130. Accordingly, a phenomenon in which the first printed circuit board 510 and the second driver 130 may be peeled off when they overlap with each other may be prevented or substantially prevented, and a signal interference phenomenon due to the overlap of wirings may be minimized or reduced. However, the present disclosure is not limited thereto, and in some embodiments, the first printed circuit board 510 may overlap with a portion of the second printed circuit board 610 and/or with a portion of the second driver 130, and may be disposed so as to be spaced apart therefrom as much as possible through the change of, for example, the shape, the structure, and/or a wiring design, thereby minimizing or reducing the peeling off and interference phenomena.

In an embodiment, although not illustrated in FIG. 10, as described with reference to FIGS. 3 to 8, the first adhesive may be disposed between the first pad and the second pad 545, and the second adhesive may be disposed between the display panel and the first printed circuit board 510.

Figure 11:
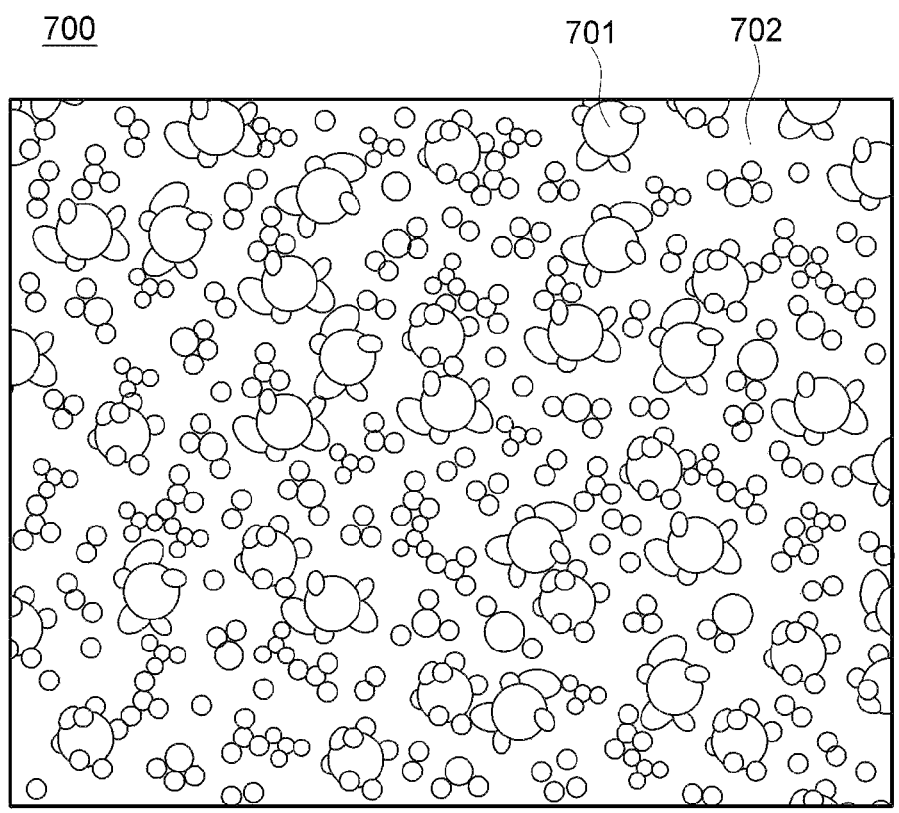
FIG. 11 is an enlarged plan view illustrating a second adhesive according to an embodiment of the present disclosure.

FIG. 11 is an enlarged plan view illustrating the second adhesive 700 according to an embodiment of the present disclosure.

Referring to FIG. 11, the second adhesive 700 according to an embodiment of the present disclosure may include a filler 701, and a binder 702 for securing the filler 701. The filler 701 may include particles having a size in a range from 2 nm to 500 nm.

The filler 701 includes at least one of $BaSO_4$, $TiO_2$, $SiO_2$, or carbon black. The filler 701 may have a size in a range from 2 nm to 500 nm, and may have a circular shape, a rod shape, or an irregular shape.

The binder 702 may include at least one of acrylic resins or epoxy resins.

The second adhesive 700 may be applied by silk imprinting, a deposition process, or the like.

The second adhesive 700 may further include a solvent capable of dissolving the binder 702. The solvent may be volatilized in a bonding process with the first printed circuit board (e.g., see 510 of FIG. 6), but may partially remain in the second adhesive 700.

The second adhesive 700 may improve adhesion with the first printed circuit board by performing a plasma treatment on an upper surface of the second adhesive 700.

An adhesive force between the second adhesive 700 and the first printed circuit board may be about 1.0 kgf/in to about 3.5 kgf/in or greater. For example, the adhesive force between the second adhesive 700 and the first printed circuit board 200 may be in a range from about 1.0 kgf/in to about 4 kgf/in.

Accordingly, the second adhesive 700 may provide an additional adhesive force to enhance the adhesive force of the first adhesive 370 that attaches the first pad (e.g., see 200 of FIG. 6) of the display panel (e.g., see 100 of FIG. 6) and the first printed circuit board to each other.

According to one or more embodiments of the present disclosure, when a pressure according to user's touch is applied to a connection portion between a sensor and a printed circuit board, a conductive tape attached to a pad may be prevented or substantially prevented from being spaced apart (e.g., from being separated) from the printed circuit board by a second adhesive configured to attach the sensor and the printed circuit board to each other. Accordingly, a connection between the sensor and the printed circuit board may be enhanced (e.g., may be improved) by the second adhesive.

In addition, by printing a sensing electrode on a display panel, without using a sensor sheet which occupies an additional thickness, a thickness of the display device may be reduced, and material costs may be reduced.

In addition, by disposing a sensing printed circuit board and a main printed circuit board to be spaced apart from each other so as to not overlap with each other, it may be possible to prevent or substantially prevent the sensing printed circuit board and the main printed circuit board from being peeled off, and a signal interference caused by overlapping of wirings may be minimized or reduced (e.g., substantially reduced).

The display device according to one or more embodiments of the present disclosure may strengthen a connection between a printed circuit board and a sensor, thereby contributing to the development of technology in the field of display devices.

Although some embodiments have been described with reference to the accompanying drawings, those skilled in the art will readily appreciate that various modifications are possible in the embodiments without departing from the spirit and scope of the present disclosure. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a display panel;
   a bracket opposite the display panel;
   a sensing electrode configured to form a capacitance with the bracket;
   a first pad connected to the sensing electrode;
   a first printed circuit board overlapping with the first pad;
   a first adhesive contacting the first pad and the first printed circuit board; and a second adhesive contacting the display panel and the first printed circuit board, wherein the second adhesive has an adhesive force greater than an adhesive force of the first adhesive.

2. The display device of claim 1, further comprising an elastic element between the display panel and the bracket,
wherein the sensing electrode is located between the elastic element and the display panel.

3. The display device of claim 1, wherein the second adhesive is spaced from the first adhesive in a plan view.

4. The display device of claim 1, further comprising a second pad on the first printed circuit board,
wherein the first adhesive contacts the first pad and the second pad, and
wherein the second adhesive is spaced from the second pad and the first adhesive, and partially surrounds the first adhesive in a plan view.

5. The display device of claim 1, wherein the first adhesive comprises a conductive tape, and the second adhesive comprises a non-conductive tape.

6. The display device of claim 1, wherein the first adhesive comprises a conductive sponge.

7. The display device of claim 1, wherein an adhesive force between the second adhesive and the first printed circuit board is greater than an adhesive force between the first adhesive and the first printed circuit board.

8. The display device of claim 1, further comprising a second printed circuit board connected to the first printed circuit board through a wiring,
wherein the second printed circuit board and the first printed circuit board are spaced from each other and do not overlap with each other.

9. The display device of claim 8, further comprising:
a first driver mounted on the first printed circuit board, and electrically connected to the first pad; and
a second driver connected to the display panel,
wherein the second printed circuit board is connected to the first driver through a wiring, and the first driver is connected to the second driver through a wiring.

10. The display device of claim 1, wherein the second adhesive comprises:
a filler comprising particles having a size in a range from 2 nanometers (nm) to 500 nm; and
a binder securing the filler.

11. The display device of claim 10, wherein the filler comprises at least one of $BaSO_4$, $TiO_2$, $SiO_2$, or carbon black.

12. The display device of claim 10, wherein the binder comprises at least one of an acrylic resin or an epoxy resin.

13. The display device of claim 1, wherein the second adhesive has an adhesive force in a range from 1.0 kgf/in to 3.0 kgf/in.

14. A display device comprising:
a display panel;
a bracket opposite the display panel;
a sensing electrode configured to form a capacitance with the bracket;
a first pad connected to the sensing electrode;
a first printed circuit board overlapping with the first pad;
a second printed circuit board connected to the first printed circuit board by a wiring;
a first adhesive contacting the first pad and the first printed circuit board; and
a second adhesive contacting the display panel and the first printed circuit board,
wherein the first printed circuit board and the second printed circuit board are spaced from each other and do not overlap with each other, and
wherein the second adhesive has an adhesive force greater than an adhesive force of the first adhesive.

15. The display device of claim 14, wherein the second adhesive is spaced from the first adhesive, and partially surrounds the first adhesive in a plan view.

16. The display device of claim 15, wherein the first adhesive comprises a conductive tape or a conductive sponge, and the second adhesive comprises a non-conductive tape.

* * * * *